United States Patent
Blank et al.

(10) Patent No.: US 10,598,721 B2
(45) Date of Patent: Mar. 24, 2020

(54) MOBILE HIGH-VOLTAGE TESTER

(71) Applicant: B2 ELECTRONIC GMBH, Klaus (AT)

(72) Inventors: Rudolf Blank, Sulz (AT); Stefan Baldauf, Rankwell (AT)

(73) Assignee: B2 ELECTRONIC GMBH, Klaus (AT)

(*) Notice: Subject to any disclaimer, the term of this patent is extended or adjusted under 35 U.S.C. 154(b) by 976 days.

(21) Appl. No.: 14/820,618

(22) Filed: Aug. 7, 2015

(65) Prior Publication Data

US 2015/0346269 A1 Dec. 3, 2015

Related U.S. Application Data

(63) Continuation of application No. PCT/EP2014/000199, filed on Jan. 25, 2014.

(30) Foreign Application Priority Data

Feb. 8, 2013 (DE) .......................... 10 2013 002 114

(51) Int. Cl.
*G01R 31/14* (2006.01)
*G01R 31/08* (2006.01)
(Continued)

(52) U.S. Cl.
CPC .............. *G01R 31/14* (2013.01); *G01R 31/08* (2013.01); *G01R 27/2694* (2013.01); *G01R 31/1272* (2013.01)

(58) Field of Classification Search
CPC .... G01R 31/14; G01R 31/08; G01R 27/2694; G01R 31/1272
See application file for complete search history.

(56) References Cited

U.S. PATENT DOCUMENTS 6,169,406 B1 * 1/2001 Peschel .................. G01R 31/14
324/511
2010/0118491 A1 5/2010 Blank et al.
(Continued)

FOREIGN PATENT DOCUMENTS

DE 749492 C 11/1944
DE 3737373 A1 10/1988
(Continued)

OTHER PUBLICATIONS

Extended European search report including the European search opinion issued for corresponding European Patent Application No. PCT/EP2014/000199 dated Jan. 25, 2015.
(Continued)

*Primary Examiner* — Huy Q Phan
*Assistant Examiner* — Zannatul Ferdous
(74) *Attorney, Agent, or Firm* — Myers Wolin, LLC

(57) ABSTRACT

A mobile tester is provided for "Very Low Frequency" (VLF) testing of a measurement object, which has means for generating an AC voltage which has an effective amplitude of greater than or equal to 1 kV and a frequency in the range of between 0.01 and 1 Hz, a connection element for connecting the measurement object, and means for measuring and evaluating the test voltage applied to the measurement object and the test current caused thereby. In a first operating mode, the tester autonomously carries out a VLF test using the test voltage generated. The tester also has a communication interface for emitting a synchronization signal or for receiving an externally generated synchronization signal, and the tester is set up, in a second operating mode, to synchronize the generated test voltage with the test voltage generated by at least one further tester of the same type.

13 Claims, 2 Drawing Sheets

(51) Int. Cl.
*G01R 31/12* (2020.01)
*G01R 27/26* (2006.01)

(56) References Cited

U.S. PATENT DOCUMENTS

| | | | |
|---|---|---|---|
| 2011/0062967 A1* | 3/2011 | Mohaupt | G01R 31/14 |
| | | | 324/652 |
| 2011/0068806 A1 | 3/2011 | Mohaupt | |
| 2011/0267854 A1 | 11/2011 | Flannery et al. | |
| 2011/0282607 A1* | 11/2011 | Tunell | G01R 31/023 |
| | | | 702/65 |
| 2012/0307726 A1* | 12/2012 | Pi | H04J 11/0069 |
| | | | 370/328 |
| 2013/0093455 A1* | 4/2013 | Whetsel | G01R 31/31854 |
| | | | 324/762.03 |
| 2013/0295858 A1* | 11/2013 | Olgaard | H04B 17/0085 |
| | | | 455/67.14 |

FOREIGN PATENT DOCUMENTS

| | | |
|---|---|---|
| DE | 10206788 A1 | 8/2003 |
| DE | 102007034558 A1 | 1/2009 |
| EP | 1324480 A2 | 7/2003 |
| JP | 2006200898 A | 8/2006 |
| WO | 2009143543 A2 | 12/2009 |
| WO | 2011017802 A1 | 2/2011 |

OTHER PUBLICATIONS

International Preliminary Report on Patentability including the written opinion of the International Searching Authority for International Application No. PCT/EP2014/000199 dated Aug. 11, 2015.

* cited by examiner

MOBILE HIGH-VOLTAGE TESTER

CROSS REFERENCE TO RELATED APPLICATIONS

This application is a continuation under 35 U.S.C. § 120 International Application PCT/EP2014/000199, filed Jan. 25, 2014, which claims priority to German Application 10 2013 002 114.6, filed Feb. 8, 2013, the contents of each of which are incorporated by reference herein.

FIELD OF THE INVENTION

The present invention relates to a mobile tester for VLF ("very low frequency") testing of a measurement object, especially a high-voltage or medium-voltage cable, comprising means for generating an a.c. voltage, used as the test voltage, with rms amplitude greater than or equal to 1 kV and a frequency in the range between 0.01 and 1 Hz, a terminal element for connection of the measurement object to be subjected to the test voltage and means for measurement and evaluation of the test voltage present at the measurement object and of the test current caused hereby, wherein the tester in a first mode of operation is set up for autonomous performance of a VLF test with the test voltage generated by it. Furthermore, the present invention relates to a system as well as to a method for VLF testing of a measurement object.

BACKGROUND

Mobile (high-voltage) testers of the type mentioned in the introduction are adequately known from the prior art and are used for what is known as "very low frequency" (VLF) testing of measurement objects, which may be the most diverse electrical or electronic components or in particular high-voltage or medium-voltage cables. With VLF testing, the measurement object is subjected to a usually sinusoidal a.c. voltage with an rms voltage in the kV range and—by determination and evaluation of the test voltage present at the measurement object and of the test current caused hereby—information is obtained as to whether the tested measurement object has withstood the test voltage without voltage breakdown for a specified period. In the case of successive increases of the test voltage, it is then also possible to determine, for example, the test voltage at which voltage breakdowns relevant to safety first occur or have occurred.

Furthermore, with specially configured VLF testers of the aforesaid type, in conjunction with evaluation of the exact phase shift between test voltage and test current, it is also possible to determine the so-called loss factor (tan δ) of the measurement object and to use the results to estimate, for example, the quality or aging condition of the insulation of high-voltage or medium-voltage cables by means of a non-destructive test. The measurement and evaluation algorithms to be applied in this respect (and the measuring and evaluating circuits necessary for them) are adequately known to the person skilled in the pertinent art.

Particularly in the case of VLF testing of high-voltage or medium-voltage cables, the requirements imposed on the electrical power to be applied by VLF testers of the class in question become especially strict with increasing length of the cable to be tested, and the costs of mobile testers of the class in question rise rapidly with increasing output power. In practice, therefore, mobile testers of the type mentioned in the introduction are offered in various power classes, the service capabilities of which—depending on the voltage amplitudes that can be generated with the tester in question and on the output power available as a result—are limited. At present, mobile VLF testers with means for generating a sinusoidal VLF test voltage in a range of up to 200 kV peak voltage (corresponding to approximately 141 kV rms voltage) are available with electrical output powers of up to approximately 8 kW.

In view of the prior art mentioned in the foregoing, the object is to improve a VLF tester as well as a system and a method of the type mentioned in the introduction to provide additional value for the user in the functional respect.

SUMMARY

This object is achieved with a mobile tester, which is characterized not only by the features mentioned in the introduction but also in that the tester has a communications interface for transmitting a synchronization signal and/or for receiving an externally generated synchronization signal and in that the tester is set up, in a second mode of operation (parallel mode) to synchronize the generated test voltage as a function of the synchronization signal with the test voltage generated by at least one further tester of the same type.

Thus an inventive mobile high-voltage tester is capable in highly flexible manner of being used not only in a first mode of operation (standalone mode) for complete autonomous performance of a VLF test on a measurement object but also in a second mode of operation (parallel mode) in parallel with at least one second mobile tester of inventive type. On the basis of the test voltage synchronization provided in parallel mode, at least two inventive testers can then be used simultaneously for the VLF test of a measurement object—to be connected to both testers. Under these conditions, the output powers made available by the at least two testers are added cumulatively.

Thus a user or purchaser of inventive testers will be given the opportunity, if necessary, to use at least two or more inventive mobile testers simultaneously to perform a VLF test on one and the same measurement object, whereby the electrical power available for the VLF test is multiplied in accordance with the number of instruments used simultaneously in parallel mode.

During parallel operation of a plurality of inventive testers, therefore, longer high-voltage and medium-voltage cables can be subjected to a VLF test than is possible with a single mobile tester of the class in question or of the inventive type.

In connection with the present invention, it is then simultaneously assured that every inventive tester as such is still suitable for standalone operation, whereby, for example, a company that is in possession of several inventive testers, either can subject various measurement objects at various locations simultaneously to a VLF test with one tester each or else can bundle a plurality of inventive testers at one point of use, in order to subject one measurement object, which because of a particularly high power demand for a VLF test to be performed thereon would not be testable with a single tester, to the desired VLF test there with the necessary electrical power by using a plurality of inventive testers simultaneously.

During such a testing or measuring operation, obviously care has to be taken that the measurement object to be tested is connected in a parallel circuit to the terminal elements provided for the purpose of all mobile testers being used. The achieved synchronization of the test voltage generated by all inventive testers by means of a synchronization signal ensures the delivery of a suitable VLF test voltage during simultaneous use of several testers, in which case care must obviously be taken during parallel operation of several testers of inventive type that all testers synchronize the test voltage generated by them on the basis of the same synchronization signal in the same way.

During parallel operation of a plurality of testers in connection with synchronization of the a.c. voltage to be generated by the individual testers, obviously care must be taken that all testers deliver a test voltage of identical amplitude and frequency.

The a.c. voltage delivered during parallel operation of the individual testers may be advantageously a sinusoidal a.c. voltage, preferably with a frequency of 0.1 Hz, although other voltage profiles would also be possible in principle, such as a cosine square-wave voltage.

In the case of a sinusoidal a.c. voltage, the necessary synchronization of several testers by means of a synchronization signal proves to be particularly however, whereas considerably stricter requirements may have to be imposed on synchronization of other voltage profiles (such as cos square wave), because of voltage changes occurring on shorter time scales there.

The a.c. voltage needed for the VLF test is delivered by an inventive tester with standard means for the purpose and in the standard way, e.g. by suitable frequency transformation and amplification of a line voltage delivered via a suitable terminal to the tester, while in principle even battery operation of inventive testers is conceivable, as is already known from the prior art for VLF testers of the class in question.

The present invention also serves the economic interests of users of VLF testers, since then they do not have to acquire and maintain an individual, particularly expensive mobile tester of the class in question for VLF tests, which may have to be performed only infrequently, of particularly long high-voltage or medium-voltage cables. Instead, a company specialized in the testing of high-voltage and medium-voltage cables, for example, will be able to acquire a plurality of inventive VLF testers successively with relatively low investment outlays for each, for use respectively in standalone operation in normal business operation for typical applications. At the same time, however, the company in question wilt successively become capable of subjecting even longer cables to VLF testing if so needed. Another advantage in this respect is that a user of one or more inventive testers will be able to borrow or lease at least one further mobile tester of inventive type in order to increase the electrical power available to it for VLF testing by means of special measuring operations, and so, in connection with the present invention, ultimately economic benefits for the user of (inventive) VLF testers are also created with technical means.

The present invention further relates to a system for VLF testing of a measurement object, which system comprises at least two inventive mobile testers of the type described in the foregoing, wherein the system is set up, during operation of all testers in parallel mode and suitable connection of the measurement object to all testers, to ensure that the testers interact with one another through synchronization of the a.c, voltage generated respectively by them for the VLF test of the measurement object in such a way that the measurement object is subjected simultaneously to the synchronized a.c. voltages of all testers.

Obviously the measurement object to be tested must be connected for this purpose to the terminal elements of the at least two testers by means of a suitable parallel circuit, so that the measurement object is simultaneously subjected to the synchronized a.c. voltage of the at least two testers operated in parallel mode, whereby the electrical power delivered by all testers of the system in the sense already described hereinabove is added cumulatively or in the case of testers with respectively identical output power is correspondingly multiplied.

For the sake of good order, it must be remarked that obviously all preferred improvements of an inventive system described hereinafter may also be regarded as preferred embodiments of an inventive tester, to the extent that they relate to the testers as such or to their characteristics. At the same time, all aspects and advantages of an inventive tester explained in the foregoing are obviously applicable in the same way for an inventive system comprising a plurality (i.e. at least two) inventive testers.

During use of an inventive system, preferably at least one or even more preferably exactly one of the testers operated in parallel triode can be set up for measurement and evaluation of the test voltage present at the measurement object, for which purpose the measurement and evaluation circuit also used in standalone operation of the instrument in question may be used. Likewise a (redundant) measurement of the test voltage by several or all testers can be performed, although ultimately it makes little sense, since the same test voltage is present at each tester during parallel operation.

The electrical current generated (in total) by the VLF test voltage in the measurement object either may be measured directly at the measurement object, e.g. by means of a separate current-measuring device, or else preferably may be determined by the measurement and evaluation circuits that are already present in any case in the individual testers. In this respect, namely the addition of the respective (test) currents measured individually in all testers yields the total current caused in the measurement object by the test voltage, and so, in a preferred improvement of the inventive system, it is provided that, in parallel mode, all testers are set up to measure the test current flowing due to the test voltage in the tester in question.

Furthermore, it may be provided in an advantageous embodiment of the inventive system that the system has a (central) control unit that generates and transmits the synchronization signal.

In principle, this synchronization signal may be transmitted in analog or digital, cabled or wireless form, wherein in the context of the present invention it is ultimately necessary to ensure merely that all testers of the system that receive the signal in question via their communications interface provided for the purpose are so set up in their parallel mode that they synchronize the a.c. voltage generated by them appropriately as a function of the synchronization signal.

It is further advantageous when all testers operated in parallel mode can be controlled via a (central) control unit, wherewith, for example, the voltage amplitude of the test voltage generated by all testers—while simultaneously maintaining the synchronization—could be synchronously changed via the control unit, for example in order to raise the amplitude of the a.c. voltage to be generated by all testers successively and simultaneously to a maximum voltage. In the case of a digital synchronization signal, this therefore carries not only a clock signal and possibly the information on the frequency to be specifically set but also information on the voltage amplitude to be specified by the testers.

In yet another preferred improvement of the inventive system, it is provided that the system has a central evaluation unit, to which all voltage and/or current values needed for evaluation of the VLF test and measured by the various testers in parallel mode are transmitted. For this purpose, obviously all testers of the system should have a suitable interface, with which the data concerning them can be communicated either wireless or cabled form—to the evaluation unit, in which case the said interface may be, if necessary, the same communications interface with which the individual testers are able to receive (or transmit) the synchronization signal. In the case of cabled signal transmission, the individual testers or their communications) interfaces must be connected in an appropriate way to the control unit and/or to the evaluation unit or to one another.

Advantageously the control unit and/or the central evaluation unit is/are integrated into one of the testers or into an external device. In the former case the tester containing the control unit, for example, is able to generate the synchronization signal and to transmit it via its communications interface for reception by all further testers of an inventive system, so that the tester in question functions, as it were, as a "master" tester. Preferably, such a "master" tester may then also contain the central evaluation unit, wherewith central evaluation of a VLF test performed simultaneously by several testers can also be achieved by the "master" tester.

In other respects, as regards the synchronization signal provide according to the invention for voltage synchronization, it may be provided that the synchronization signal is repeated continuously or iteratively while the measurement object is being subjected to the test voltage (generated by all testers) and to the VLF test then in progress. Equally possible, however, is also the use of a synchronization signal transmitted—only before the actual high-voltage release or VLF test—to ensure that the testers, which were connected beforehand in their parallel mode of operation, can begin generating an a.c. voltage of specified amplitude and frequency simultaneously, for example by using a suitable timer function, so that synchronization in the inventive sense can also be achieved in this case by specifying a starting instant for generation of the high voltage.

Using the means that are present in the tester in any case for generating an a.c. voltage to be used as test voltage, such a synchronization signal can be generated in the form of an a.c. voltage with specific characteristic, for example, by a "master" tester connected in parallel mode of operation, whereby the said means for generating the a.c. voltage simultaneously function as the communications interface for transmission of the synchronization signal. This synchronization signal can then be detected or received by the means that are also present in the further testers in any case for measurement and evaluation of the test voltage present at the measurement object, so that the means for measurement and evaluation of the test voltage then simultaneously function in the further testers as the communications interface for reception of the external synchronization. This alternative embodiment has the advantage that no additional communications interface has to be provided for this purpose in the individual testers and that the conductor or distributor structure connecting the individual testers to one another and provided in any case for subjecting the measurement object to the test voltage can be used for cabled transmission of the synchronization signal.

Furthermore, it may be advantageously provided in connection with the present invention that the (central) control unit and/or the central evaluation unit is/are integrated into an external device, e.g. a mobile data-processing device, such as a laptop, since under such conditions central synchronization, control and/or evaluation of the VLF test are also possible in particularly simple manner.

As already mentioned hereinabove, the synchronization signal may also be transmitted advantageously in wireless form, in which case obviously the communications interfaces provided in the various (test) instruments for transmission/reception of the synchronization signal must be set up for wireless communications. Such communication may be based on a conventional standard for wireless communication, including, for example, Bluetooth, W-LAN or other radio standards. In particular, it must be mentioned that synchronization of the a.c. voltage to be generated by the testers can also be achieved sufficiently exactly in terms of time via the cited standards, since it has a frequency in the range of only 0.01 to 1 Hz, advantageously 0.1 Hz, Wherewith synchronization with an accuracy in the millisecond range may be absolutely sufficient.

Within the scope of the present invention, it can then be ensured particularly advantageously that, starting from the specified number of at least two mobile testers, the system can be expanded respectively by one further inventive tester up to a given maximum number of testers, wherewith a system configuration capable of being adapted particularly flexibly to various measurement situations is obtained. The inventive system can be expanded conveniently by individual testers until the total available electrical power is sufficient for a VLF test on the measurement object to be specifically tested.

In practice, the maximum number of VLF testers that can be operated in parallel mode within the scope of the present invention is limited by the particular system configuration, for example to a number in the range between 10 and 25 devices, and so, by using VLF testers, electrical powers of 20-50 kW can already be made available with an inventive system comprising 10-25 testers with output powers of approximately 2 kW each when they are operated in parallel mode.

Since the measurement object to be tested in a parallel circuit must always be connected to all testers to an inventive system, it is advantageous when the system is provided for this purpose with a (pre-assembled) distributor structure, which has a specified maximum number of testers capable of being connected thereto and which connects the terminal elements provided for the measurement object on the at least two testers and the measurement object to be tested in the manner of a parallel circuit.

Furthermore, it should be ensured particularly expediently within the scope of the invention that the at least two testers are connected to a common ground potential.

Finally, in yet another preferred improvement of the inventive system, it is provided that each tester is set up for simultaneous VLF testing of three phases of a high-voltage or medium-voltage cable with the same test voltage, wherewith three-phase high-voltage and/or medium-voltage cables can also be subjected in particularly time-saving manner to a VLF test.

The present invention also relates to a method for VLF testing of a measurement object using at least two inventive testers or to an inventive system of the type described in the foregoing comprising the following steps:

A) Connecting the measurement object to the respective terminal elements of all testers by means of a parallel circuit
B) Activating the parallel mode in all testers
C) Generating and transmitting a synchronization signal
D) Simultaneously generating, with all testers, an a.c. voltage synchronized on the basis of the synchronization signal E) Measuring and evaluating the test voltage present at the measurement object and the test current caused hereby in the measurement object or in the individual testers.

It is self-evident that, for example, this sequence of steps (B) and (C) of the method is not critical, and that all advantages and preferred embodiments already explained hereinabove in connection with inventive testers or with the inventive system, especially with respect to how they function and operate, can equally well be adopted in the inventive method, and so they are incorporated here by reference in order to avoid repetitions.

BRIEF DESCRIPTION OF THE DRAWINGS

Two exemplary embodiments of the invention will be explained hereinafter on the basis of the drawing, wherein.

DETAILED DESCRIPTION OF THE PREFERRED EMBODIMENTS

Figure 1:
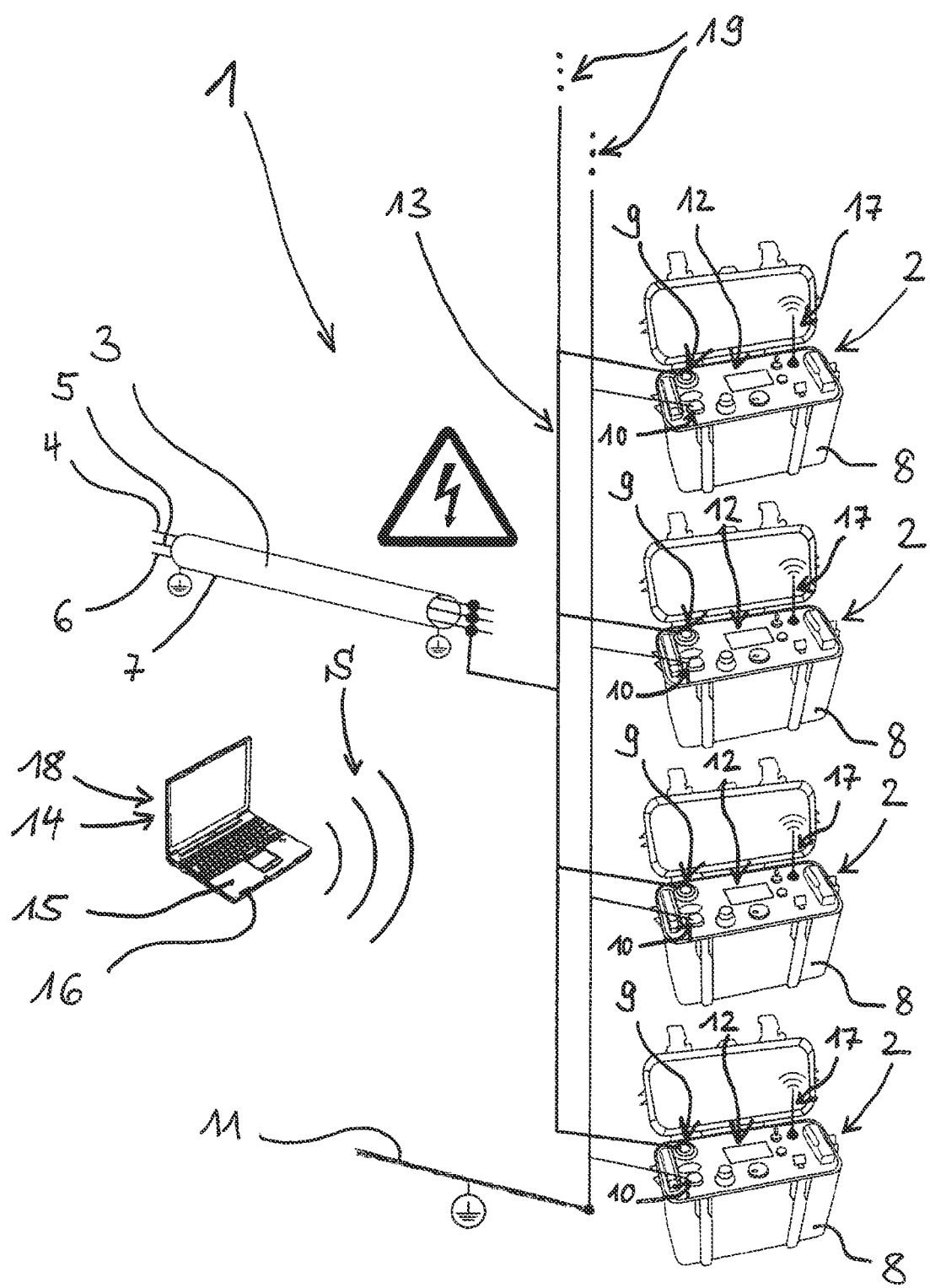
FIG. 1 shows a first exemplary embodiment of an inventive system comprising in total four inventive testers and FIG. 2 shows a second exemplary embodiment of an inventive system comprising in total four inventive testers.

FIG. 1 schematically shows a first exemplary embodiment of an inventive system 1, which in the present case comprises in total four inventive mobile testers 2 of identical design for VLF testing of a measurement object 3, in the present case in the form of a shielded high-voltage or medium-voltage cable with three phases 4, 5, 6, the shielding 7 of which, usually designed as conductive braid, can be connected appropriately to a protective ground, at the potential of which the ground for testers 2 is also located.

Each of the mobile testers 2 is provided in its housing 8 with standard means—not illustrated in the figure—for generating an a.c. voltage, used as the test voltage, with rms amplitude greater than or equal to 1 kV and a frequency in the range between 0.01 and 1 Hz. Furthermore, a terminal element 9 for connection of measurement object 3 to be subjected to the test voltage is provided on each tester 2, wherein each tester 2 is set up in the present case for simultaneous VLF testing of all three phases 4, 5, 6 of high-voltage or medium-voltage cable 3 with the same test voltage.

Furthermore, each tester 2 is provided in its housing 8 with standard means—also not illustrated in the figure— namely a suitable measurement and evaluation circuit, for measurement and evaluation of the test voltage present at measurement object 3 (or its three phases 4, 5, 6) and of the test current caused hereby (inside tester 2).

Each tester 2 is additionally provided with a further terminal element 10, via which each tester 2 can be grounded or all testers 2 can be connected to a common ground potential 11.

Each tester 2 is set up in a first mode of operation for completely autonomous performance of a VLF test on a measurement object 3 using the test voltage generated by it, meaning that, by generating a preferably sinusoidal VLF a.c. voltage (rms voltage)>1 kV, frequency between 0.01 and 1 HZ, preferably approximately 0.1 Hz), it is capable in standalone operation of performing a VLF test of standard type and if necessary also a determination in the manner typical of the art of the loss factor (tan delta) on a measurement object 3 connected to terminal element 9 of tester 2.

For control of the respective tester 2 in standalone operation, or for changeover of the respective tester 2 between first mode of operation (standalone mode) and a second mode of operation (parallel mode) as well as for displaying the data determined during a VLF test, each tester 2 is provided in a control panel area 12 with suitable display elements and controls.

In the arrangement illustrated in the figure, in which measurement object 3 in the present case is connected in a parallel circuit by means of a schematically illustrated distributor structure 13 to terminal elements 9 of all four testers 2, testers 2 can all be operated in their second mode, namely the parallel mode of operation.

For this purpose there is provided a central control unit 14, which is integrated in an external device 15, in the present case a laptop or is formed thereby. Central control unit 14 is equipped with a wireless communications interface 16, in the present case a Bluetooth interface integrated into laptop 15, via which a synchronization signal S generated by central control unit 14 is transmitted to all testers 2 of system 1, and is received as external synchronization signal S by this at communications interfaces 17 corresponding thereto of individual testers 2.

Testers 2 and synchronization signal S are configured such that each tester 2 in parallel mode is able on the basis of synchronization signal S to synchronize the a.c. voltage to be generated by it for a VLF test (preferably sinusoidal; rms voltage >1 kV; frequency between 0.01 and 1 Hz, preferably approximately 0.1 Hz) with respect to its phase position (and advantageously also with respect to its frequency and voltage amplitude, if these have not already been imposed synchronically by the individual VLF testers). Obviously cabled transmission of synchronization signal S would also be possible for this purpose, in which case the individual testers 2 would have to be connected via appropriate data or signal lines—if necessary via a router, not illustrated—to central control unit 14.

A VLF test being performed in parallel operation of testers 2 proceeds in such a way that, after all testers 2 have been changed over to parallel mode and the connection of measurement object 3 to all testers 2 in the illustrated parallel circuit has been established, all testers 2 deliver a VLF a.c. voltage that is based on synchronization signal S and is therefore synchronized among them, so that measurement object 3 is simultaneously subjected to the (synchronized) test voltage of all testers 2, in which case, during the VLF test that then takes place, at least one tester 2 determines the test voltage then present at measurement object 3 and all testers 2 determine the test currents generated or flowing in the respective tester 2 due to the test voltage. Within the scope of the invention, a load determination that usually takes place before the actual VLF test in order to determine, for example, regulation parameters for the actual VLF test, can be performed at first by any single one of testers 2.

The measured data obtained about the test voltage during the VLF test and the test currents determined by the respective testers can then be communicated via the respective communications interface 17, which for this purpose is configured for bidirectional operation, to central control unit 14, which simultaneously functions as central evaluation unit 18 and which detects any voltage breakdowns in measurement object 3 by evaluation of the measured data in the usual way and if necessary performs a determination of the loss factor of measurement object 3.

The result of the VLF test, which can be derived from the measured test voltage and the added test currents, can then be appropriately displayed or output by central evaluation unit 18.

The dotted prolongation of schematically illustrated distributor structure 13, which connects testers 2 to measurement object 3 and in the present case also functions as the common ground for all testers, indicates that inventive system 1 is set up in such a way that it can be expanded in simple manner by respectively one further tester 2, i.e. by merely connecting each further tester 2 and switching it into parallel mode of operation, in which case, by appropriate configuration of the software of central control unit 14, automatic detection of all testers to be controlled hereby can be achieved. In practice, it makes sense to limit the maximum number of testers 2 to be connected together in the inventive manner for the purpose of a system comprising, for example, 1 to 10, 15, 20 or 25 testers 2.

Figure 2:
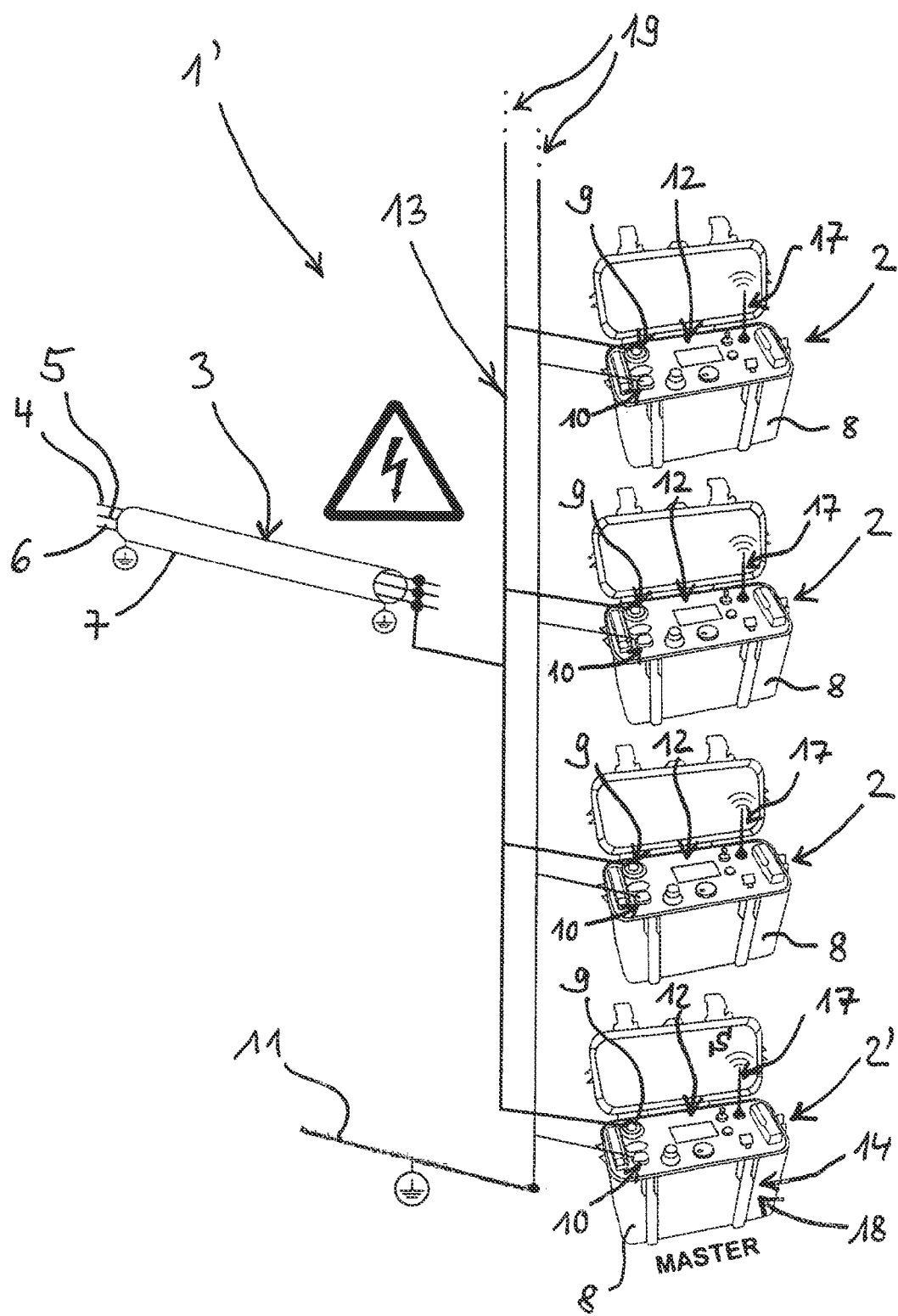

FIG. 2 shows a second exemplary embodiment of an inventive system 1', which again comprises in total four inventive testers 2, 2' and which in many respects does not differ from that of FIG. 1, and so the foregoing explanations in connection with FIG. 1 can be incorporated by reference here in order to avoid repetitions about identical aspects.

The difference compared with system 1 of FIG. 1 consists in the fact that, in system 1' of FIG. 2, central control unit 14 generating synchronization signal S and also central evaluation unit 18 are integrated not into an external device but into one of the testers 2, namely tester 2' shown at the bottom right in FIG. 2. In this tester 2', which is designated as the "master", its communications interface 17 is therefore set up for transmission of synchronization signal S, which is then received as an external signal by all further testers 2 of system 1' via their respective communications interface 17.

Via an evaluation unit 18, which is likewise integrated into "master" tester 2', the measured data of test voltage and test currents of all testers 2, 2' can then be evaluated in the usual way or if necessary relayed to an external device, not illustrated (such as a laptop).

Under these conditions, the measured data communicated from the other testers 2 via their (bidirectional) communications interface 17 are received at (bidirectional) communications interface 17 of the master tester, in a process permitted by use of a suitable communications protocol.

What is claimed is:

1. A mobile tester (2, 2') for very low frequency (VLF) testing of a measurement object (3), especially a high-voltage or medium-voltage cable, comprising
    a voltage generator for generating an a.c. voltage, used as the test voltage, with rms amplitude greater than or equal to 1 kV and a frequency in the range between 0.01 and 1 Hz,
    a terminal element (9) for connection of the measurement object (3) to be subjected to the test voltage and
    circuitry for measurement and evaluation of the test voltage present at the measurement object and of the test current caused hereby,
    wherein the tester (2, 2') is set up in a first mode of operation for autonomous performance of a VLF test with the test voltage generated by it,
    wherein the tester (2, 2') additionally has a communications interface (17) for transmitting a synchronization signal (S) or for receiving an externally generated synchronization signal (S) and
    wherein the tester (2, 2') is set up in a second mode of operation (parallel mode) to synchronize the generated test voltage as a function of the synchronization signal (S) with the test voltage generated by at least one further tester (2, 2') of the same type, such that the generated test voltage of the tester and the test voltage of the at least one further tester are additive.

2. A system (1, 1') for VLF testing of a measurement object (3), which system comprises at least two mobile testers (2, 2') of claim 1,
    wherein the system (1, 1') is set up, during operation of all testers (2, 2') in parallel mode and suitable connection of the measurement object (3) to all testers (2, 2'), to ensure that the testers (2, 2') interact with one another through synchronization of the a.c. voltage generated respectively by them for the VLF test of the measurement object (3) in such a way that the measurement object (3) is subjected simultaneously to the synchronized a.c. voltages of all testers (2, 2').

3. The system of claim 2, wherein at least one of the testers (2, 2') operated in parallel mode is set up for measurement of the test voltage present at the measurement object and
    in that, in parallel mode of operation, all testers (2, 2') are set up for measurement of the test current flowing in the tester (2, 2') in question due to the test voltage.

4. The system of claim 2, wherein the system (1, 1') has a control unit (14) that generates and transmits the synchronization signal.

5. The system of claim 4, wherein all testers (2, 2') operated in parallel mode can be controlled via the control unit (14).

6. The system of claim 2, wherein the system has a central evaluation unit (18), to which all voltage and/or current values needed for evaluation of the VLF test and measured by the various testers (2, 2') in parallel mode are transmitted.

7. The system of claim 4, wherein the control unit (14) or the central evaluation unit (18) is integrated into one of the testers (2') or into an external device (15).

8. The system of claim 2, wherein the synchronization signal (S) is transmitted in wireless form.

9. The system of claim 2, wherein, starting from the specified number of at least two mobile testers (2, 2'), the system (1, 1') can be expanded respectively by additional mobile testers (2) up to a given maximum number of testers (2, 2').

10. The system of claim 2, wherein the system (1, 1') is provided with a distributor structure (13), which has a specified maximum number of testers (2, 2') capable of being connected thereto and which connects the terminal elements (9) provided for the measurement object (3) on the at least two testers (2, 2') and the measurement object (3) to be tested in the manner of a parallel circuit.

11. The system of claim 2, wherein the at least two testers (2, 2') are connected to a common ground potential (11).

12. The system of claim 2, wherein each tester (2, 2') is set up for simultaneous VLF testing of three phases (4, 5, 6) of a high-voltage or medium-voltage cable (3) with the same test voltage.

13. A method for VLF testing of a measurement object (3) using at least two mobile testers (2, 2') according to claim 1 comprising the following steps:
    A) connecting the measurement object (3) to the respective terminal elements (9) of all testers (2, 2') by means of a parallel circuit;
    B) activating the parallel mode in all testers (2, 2');
    C) generating and transmitting a synchronization signal (S);
    D) simultaneously generating, with all testers (2, 2'), a test voltage synchronized on the basis of the synchronization signal (S);

E) measuring and evaluating the test voltage present at the measurement object (3) and the test current caused hereby in the measurement object (3) or in the individual testers (2).

* * * * *

UNITED STATES PATENT AND TRADEMARK OFFICE
CERTIFICATE OF CORRECTION

PATENT NO. : 10,598,721 B2
APPLICATION NO. : 14/820618
DATED : March 24, 2020
INVENTOR(S) : Blank et al.

Page 1 of 1

It is certified that error appears in the above-identified patent and that said Letters Patent is hereby corrected as shown below:

On the Title Page

The Applicant is indicated as "B2 ELECTRONIC GMBH, Klaus (AT)" and should instead read: "B2 ELECTRONICS GMBH, Klaus (AT)"

The Assignee is indicated as "B2 ELECTRONIC GMBH, Klaus (AT)" and should instead read: "B2 ELECTRONICS GMBH, Klaus (AT)"

Signed and Sealed this
Thirteenth Day of July, 2021

Drew Hirshfeld
*Performing the Functions and Duties of the
Under Secretary of Commerce for Intellectual Property and
Director of the United States Patent and Trademark Office*